United States Patent
Cheng et al.

(10) Patent No.: US 9,275,985 B1
(45) Date of Patent: Mar. 1, 2016

(54) RC NETWORKS THAT INCLUDE AN INTEGRATED HIGH RESISTANCE RESISTOR ON TOP OF A MOS CAPACITOR

(75) Inventors: Chuan-Cheng Cheng, Fremont, CA (US); Runzi Chang, San Jose, CA (US); Bo Wang, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/538,867

(22) Filed: Jun. 29, 2012

Related U.S. Application Data

(60) Provisional application No. 61/508,268, filed on Jul. 15, 2011.

(51) Int. Cl.
*H01L 27/06* (2006.01)
*H01L 27/11* (2006.01)

(52) U.S. Cl.
CPC ........ *H01L 27/0629* (2013.01); *H01L 27/1112* (2013.01)

(58) Field of Classification Search
CPC .................................................. H01L 27/0629

USPC ........................................... 257/310, 301, 380
See application file for complete search history.

(56) References Cited

U.S. PATENT DOCUMENTS

| | | | |
|---|---|---|---|
| 2002/0014672 A1* | 2/2002 | Noble et al. | 257/413 |
| 2006/0128092 A1* | 6/2006 | Rouse | 438/239 |
| 2006/0154459 A1* | 7/2006 | Honma et al. | 438/585 |
| 2007/0096183 A1* | 5/2007 | Ogawa et al. | 257/300 |
| 2007/0281418 A1* | 12/2007 | Hu et al. | 438/238 |
| 2010/0019328 A1* | 1/2010 | Zhang et al. | 257/380 |
| 2010/0038692 A1* | 2/2010 | Chuang et al. | 257/298 |
| 2010/0328022 A1* | 12/2010 | Fan et al. | 338/309 |
| 2011/0057267 A1* | 3/2011 | Chuang et al. | 257/380 |
| 2012/0012970 A1* | 1/2012 | Xu et al. | 257/506 |
| 2012/0280323 A1* | 11/2012 | Chuang et al. | 257/368 |

* cited by examiner

*Primary Examiner* — Christine Enad

(57) ABSTRACT

An apparatus including a resistor capacitor network that includes an integrated high resistance resistor on top of a MOS capacitor. The resistor capacitor network includes a metal oxide semiconductor capacitor portion that includes a high-k gate oxide layer. The value of k is in a range of 4.0 to 100.0. The resistor capacitor network further includes a high resistance polysilicon gate layer formed over the high-k gate oxide layer. The resistance of the polysilicon gate layer is in a range of 100 to 2000 ohms per square.

5 Claims, 11 Drawing Sheets

RC NETWORKS THAT INCLUDE AN INTEGRATED HIGH RESISTANCE RESISTOR ON TOP OF A MOS CAPACITOR

CROSS-REFERENCE TO RELATED APPLICATION

The present disclosure claims priority to U.S. Provisional Patent Application 61/508,268, filed on Jul. 15, 2011, which is hereby incorporated herein by reference.

TECHNICAL FIELD

This disclosure relates to semiconductor processing, and more particularly to resistor-capacitor (RC) networks that include an integrated high resistance (high-R) resistor on top of a metal-oxide-silicon (MOS) capacitor.

BACKGROUND

The background description provided herein is for the purpose of generally presenting the context of the disclosure. Work of the presently named inventor, to the extent it is described in this background section, as well as aspects of the description that may not otherwise qualify as prior art at the time of filing, are neither expressly nor impliedly admitted as prior art against the present disclosure.

FIG. 1 illustrates an example of resistor-capacitor (RC) network 100 that includes, among other elements, a high resistance (high-R) resistor 102 and a metal-oxide-silicon (MOS) capacitor 104 that includes a high-k metal gate 106 (where k is a dielectric constant and the high-k is with respect to the dielectric constant of silicon dioxide). High resistance is generally in a range of 100 to 2000 ohms/square, while high-k typically refers to a k value that is generally in a range of 4.0 to 100.0. Thus, the MOS capacitor 104 is generally referred to as a high-k metal gate (HKMG) MOS capacitor. The high-R resistor 102 is located on a shallow trench isolation portion 108. Thus, as can be seen, the RC network 100 generally has a fairly wide profile.

When creating HKMG MOS capacitors 104, and more particularly, an RC network 100 with modern transistors, a gate-last based HKMG integration scheme generally requires strict polysilicon density requirements due to the multiple chemical mechanical planarization (CMP) processes involved in the formation of the high-k metal gate 106. The metal gate density requirement limits the HKMG MOS capacitor 104 density per given area. This can become a major concern for high performance, low cost circuit design. A typical HKMG manufacturing process generally only offers RC networks that include high-R resistors that are formed on shallow trench isolation portions adjacent to MOS capacitors, which, as previously noted, results in the RC network having a fairly wide profile.

Prior to the HKMG embodiment of RC networks, a polysilicon gate was formed on a diffusion layer to provide a MOS capacitor. In moving to the current generation of HKMG MOS capacitors, in order to achieve the same capacitance, the area required for the MOS capacitor increases in size due to the aforementioned CMP requirements for the high-k metal gate 102. FIG. 2 illustrates an example of the transition from a polysilicon gate MOS capacitor 200 to an HKMG MOS capacitor arrangement 202. As can be seen in FIG. 2, to achieve the same capacitance in the HKMG MOS capacitor arrangement 202 as in the polysilicon gate MOS capacitor 200, four HKMG MOS capacitors 104 are needed. Thus, as can be seen in FIG. 2, a high-R resistor 102 and HKMG MOS capacitor 104 arrangement in RC networks 100 generally results in a layout area increase, thus increasing the cost of a chip that includes such RC networks.

SUMMARY

The present disclosure provides an apparatus including a resistor capacitor network. The resistor capacitor network includes a metal oxide semiconductor capacitor portion that includes a high-k gate oxide layer. The value of k is in a range of 4.0 to 100.0. The resistor capacitor network further includes a high resistance polysilicon gate layer formed over the high-k gate oxide layer. The resistance of the polysilicon gate layer is in a range of 100 to 2000 ohms per square.

BRIEF DESCRIPTION OF THE DRAWINGS

Embodiments of the present disclosure will be readily understood by the following detailed description in conjunction with the accompanying drawings. To facilitate this description, like reference numerals designate like structural elements.

DETAILED DESCRIPTION OF EMBODIMENTS OF THE DISCLOSURE

Figure 1:
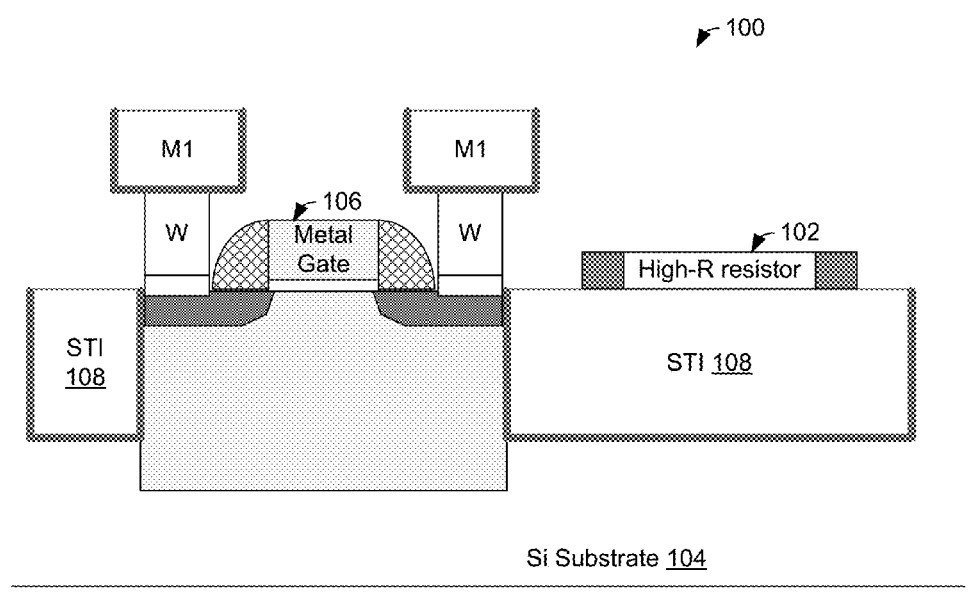
FIG. 1 is a cross-sectional view of an example of a prior art RC network.

FIG. 3 is a cross-sectional view that illustrates a resistance-capacitor (RC) network 300 that can be included within a semiconductor chip (not illustrated), in accordance with various embodiments of the present disclosure. The RC network 300 includes a high-R resistor (high-R gate) 302 and a metal oxide silicon (MOS) capacitor 304 that are integrated to provide the RC network 300. The RC network 300 includes a silicon substrate 306 that is configured with the MOS capacitor 304. The MOS capacitor 304 includes a well 308, where the well 308 is part of the silicon substrate 306 and has been doped with one of either N-type or P-type dopants. The corners 308a of the well 308 are further doped with the other type of dopant. For example, if the main portion 308b of the well 308 has been doped with N-type dopants, then the corners 308a of the well 308 are further doped with P-type dopants and vice-versa. As can be seen in FIG. 3, the well 308 is located between shallow trench isolation portions 310 of the silicon substrate 306.

The MOS capacitor 304 includes a high-k (where k is a dielectric constant and the high-k is with respect to the dielectric constant of silicon dioxide) gate oxide layer 312 that is provided at a top portion of the MOS capacitor 304. The high-R gate 302 is provided over the high-k gate oxide layer 312 between spacers 314. Contacts 316 for the MOS capacitor 304 are provided on silicide portions 318. The contacts 316 comprise, for example, a tungsten layer 320 and a metal layer 322.

Figure 3A:
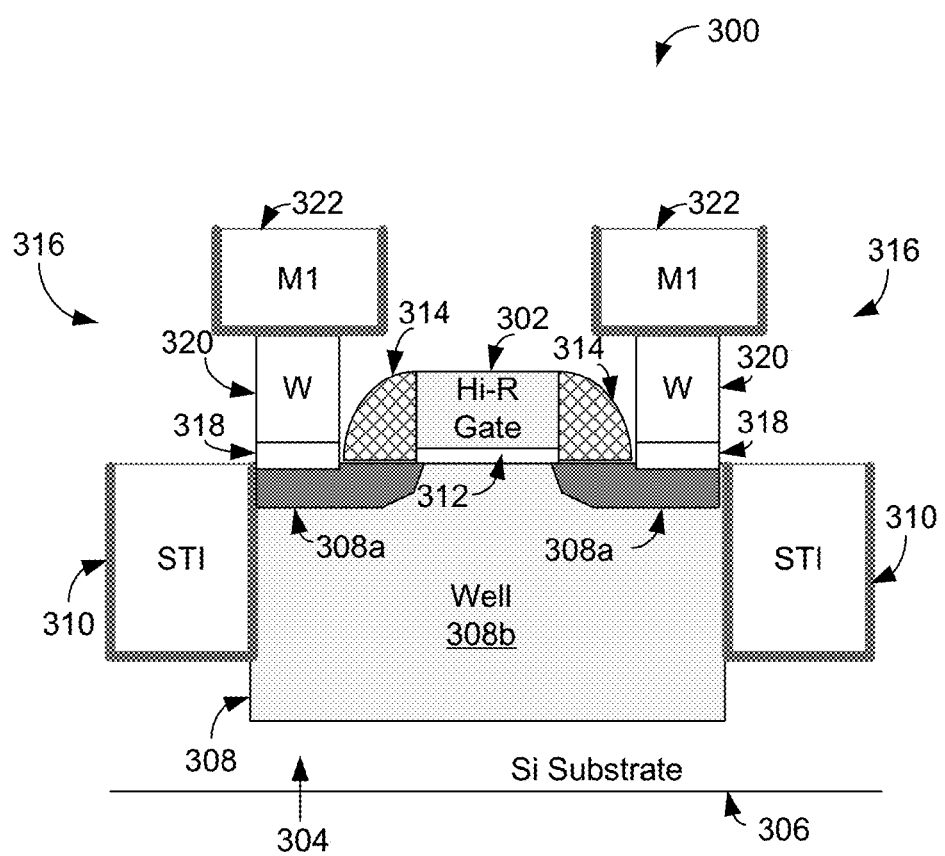
FIG. 3A is a cross-sectional view of an RC network in accordance with the present disclosure.
Figure 3B:
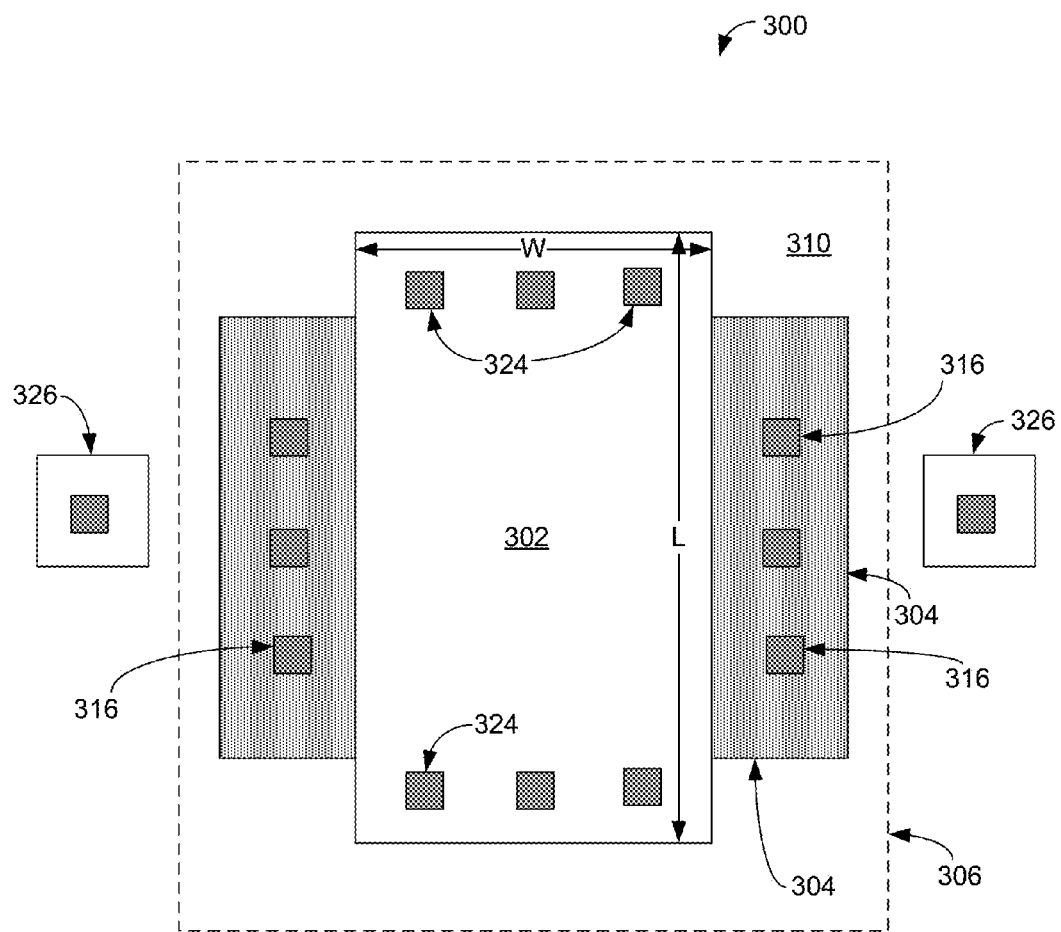
FIG. 3B is a top view of the RC network illustrated in FIG. 3A.

FIG. 3B illustrates a top view of the RC network 300. Contacts 324 for the high-R gate 302 are illustrated. As can be seen, well pick-ups 326 are provided within the silicon substrate 306.

Figure 2:
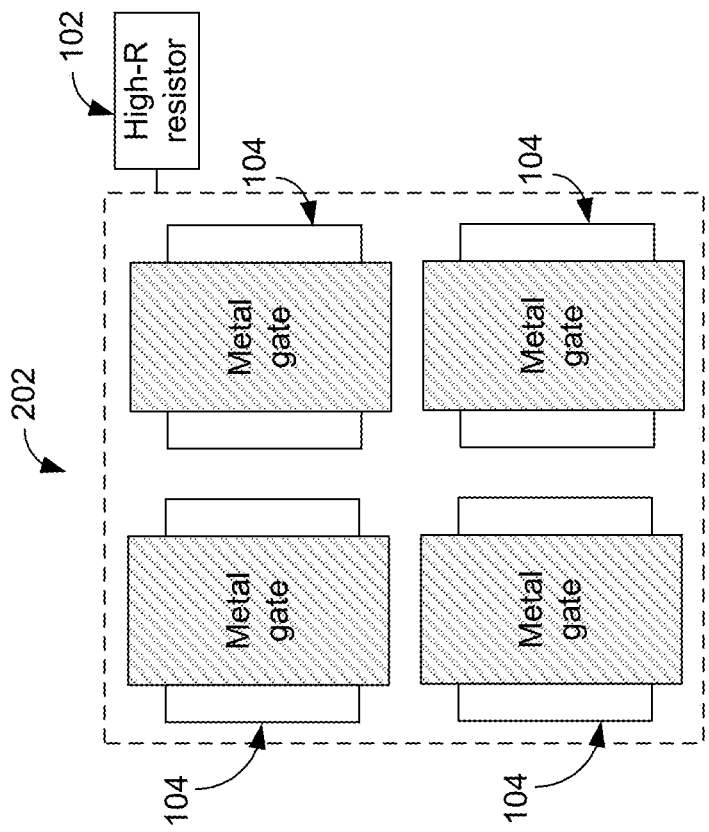
FIG. 2 is a top view of another example of a prior art RC network and a top view of the RC network illustrated FIG. 1.
Figure 2:
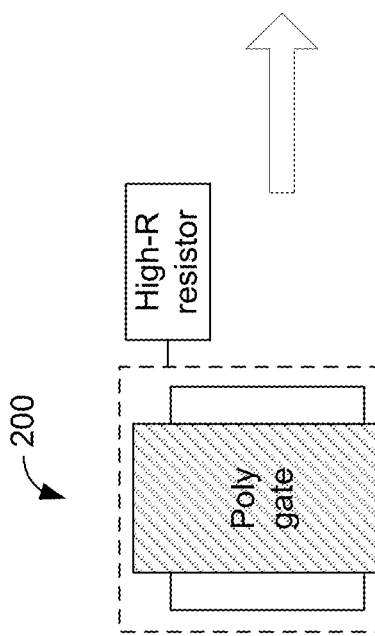

By replacing the metal gate with the high-R gate 302 in the RC network 300, the CMP process limitations can be greatly mitigated due to the polish material. For example, in one embodiment, the polysilicon of the high-R gate 302 is very different from a conventional metal gate, as a conventional metal gate generally comprises aluminum alloy or some other type of metal. The polysilicon of the high-R gate 302 is not susceptible to erosion and dishing in metal gate formation. Thus, the formation of the MOS capacitor 304 is not limited by stringent gate density requirements. The area required for an RC network 300 is greatly reduced when compared to current RC networks 100 that include HKMG MOS capacitors 104 as can be seen in FIGS. 1 and 2.

Furthermore, by combining the high-R resistor (high-R gate) together with the MOS capacitor, the resistance and capacitance ratio becomes largely tunable without sacrificing a large amount of area on the silicon substrate. Resistance of the high-R gate can be increased while maintaining the same capacitance. This can be determined based upon the width W of the high-R gate multiplied by the length L of the high-R gate. Thus, the resistance and capacitance ratio of the high-R gate and the MOS capacitor is tunable by adjusting W and L. For example, one layout could choose to enlarge the width W of the high-R resistor (high-R gate) 302 in FIG. 3B and reduce the length L of the high-R resistor (high-R gate) 302 in FIG. 3B to increase the resistance while maintaining the same capacitance.

Figure 4A:
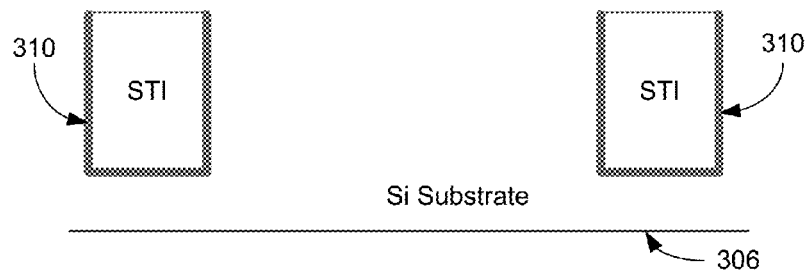
FIGS. 4A-4G illustrate various stages of an example of a process flow for forming the RC network illustrated in FIGS. 3A and 3B.
Figure 4B:
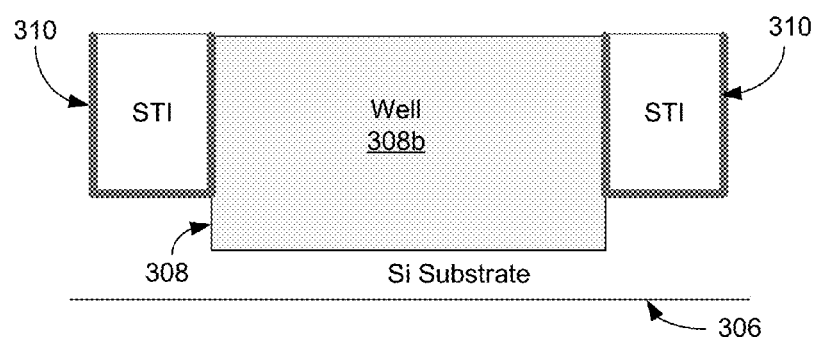

Referring to FIGS. 4A-4G, cross-sectional views of various stages of an example process flow for forming the RC network 300 of FIGS. 3A and 3B are illustrated. With reference to FIG. 4A, an initial step includes forming shallow trench isolation portions 310 on silicon substrate 306. Referring to FIG. 4B, a well portion 308 of the silicon substrate 306 is then implanted with either N-type dopants or P-type dopants.

Figure 4C:
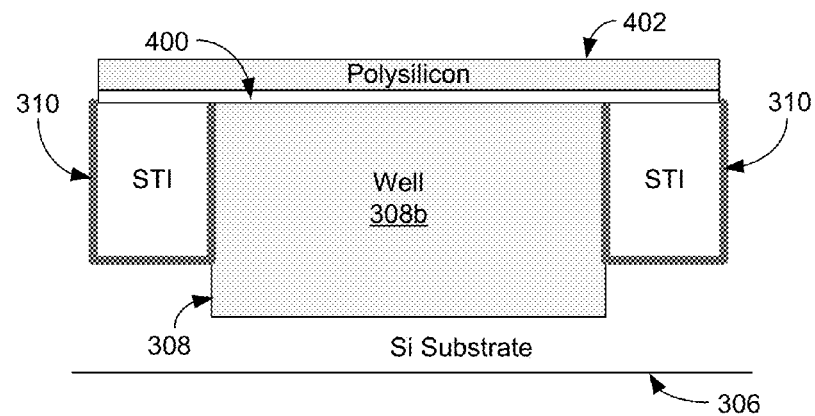

Referring to FIG. 4C, a high-k dielectric layer 400 is then formed over the shallow trench isolation portions 310 and the well portion 308. The high-k gate dielectric layer 400 can be, for example, grown or deposited. A thin conductive layer (not illustrated), e.g., titanium nitride, is deposited over the high-k dielectric layer 400 to provide a high-k gate oxide layer (e.g., the high-k gate oxide layer 312 shown in FIGS. 4D, 4E). A polysilicon layer 402 that will be formed into a high-R gate (e.g., the high-R gate 302 shown in FIGS. 4D, 4E) is then deposited over the high-k gate oxide layer 312. The polysilicon layer 402 can be doped to increase the resistance of the high-R gate 302 if desired.

Figure 4D:
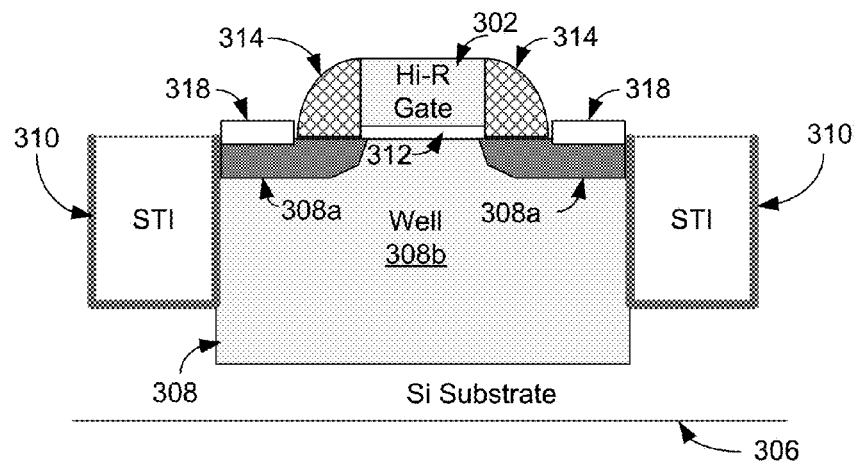

The polysilicon layer 402 is then patterned, generally by an anisotropic etching process. This provides the high-R gate 302. The anisotropic etching process also results in the spacers 314, as shown in FIG. 4D.

After the patterning of the polysilicon layer 402, implantation of the corners 308a of the well portion 308 is completed. This is achieved by implanting the opposite type of dopant within the well 308. For example, if the well was initially implanted with N-type dopants, then the corner portions 308a of the well 308 are implanted with P-type dopants, and vice versa. Silicidation is then performed at the corners 308a of the well portion 308 to provide silicide portions 318.

Figure 4E:
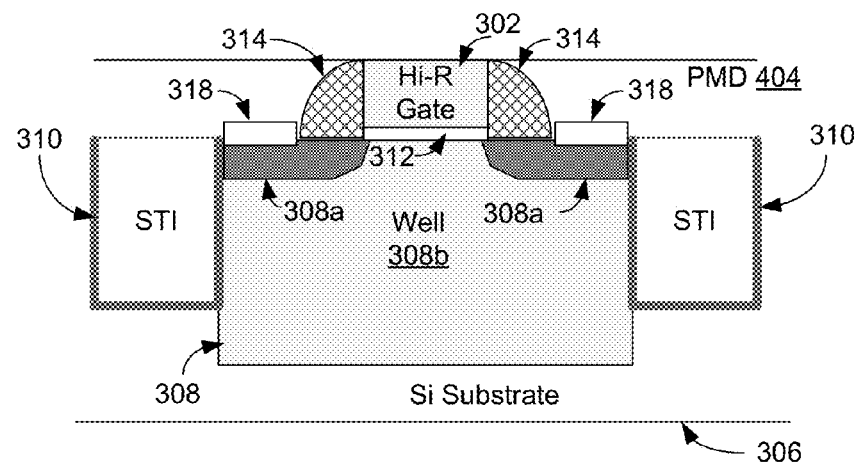

Referring to FIG. 4E, a pre-metal dielectric layer 404 is then deposited over the high-R gate 302 and the spacers 314. A chemical mechanical planarization (CMP) polish is then performed on the pre-metal dielectric layer 404 and is stopped once the high-R gate 302 is reached.

Figure 4F:
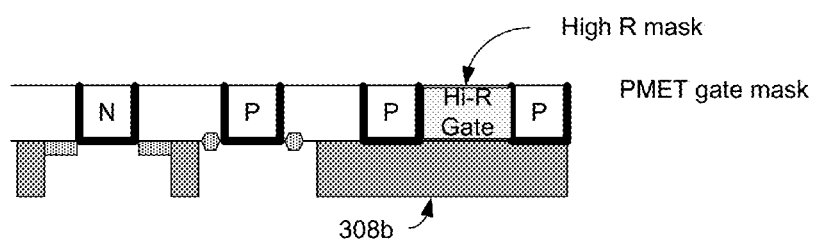

A polysilicon gate replacement can then be performed. This allows for replacing a polysilicon gate with a metal gate for the metal oxide semi-conductor transistors (not shown) in a semiconductor chip that includes the RC network 300. Also, end contacts 324 are formed for the high-R gate 302. Referring to FIG. 4F, an example of a polysilicon gate replacement process is illustrated. Two chemical mechanical planarization polish steps (damascene process) are performed. A P-type gate is replaced first with a P-type metal gate mask (PMET gate mask). An N-type metal gate is then replaced while maintaining the high-R polysilicon gate 302 with a high-R mask that is provided during the process.

Figure 4G:
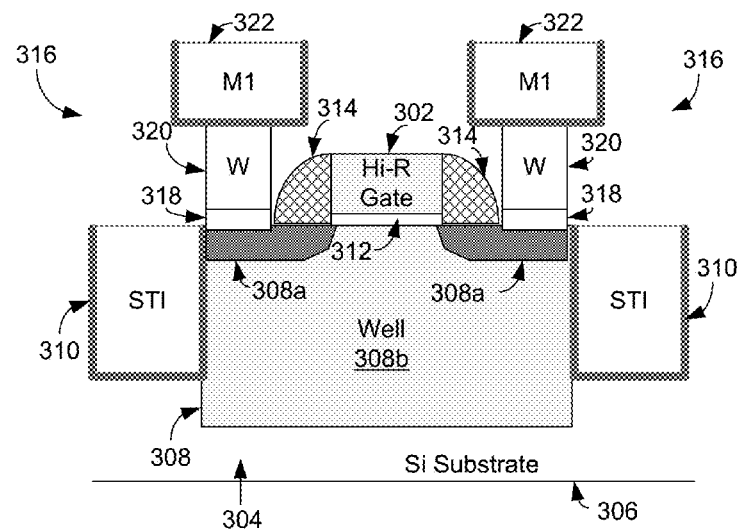

Referring to FIG. 4G, contacts 316, including layer 320 and layer 322, are then formed to complete the RC network 300. Since the processes described with respect to FIGS. 4A-4G are generally known, various details have been omitted in the description.

Figure 5A:
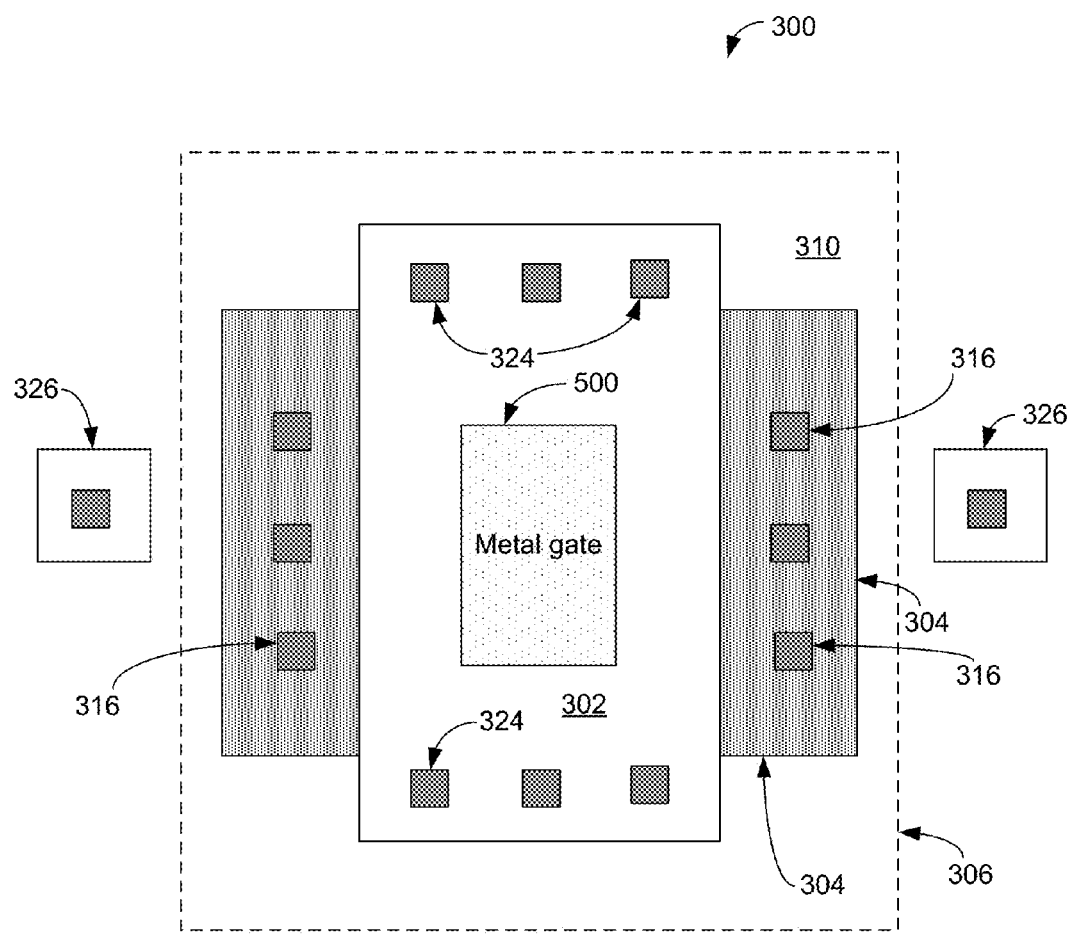
FIGS. 5A and 5B are top views of different examples of RC networks in accordance with the present disclosure.
Figure 5B:
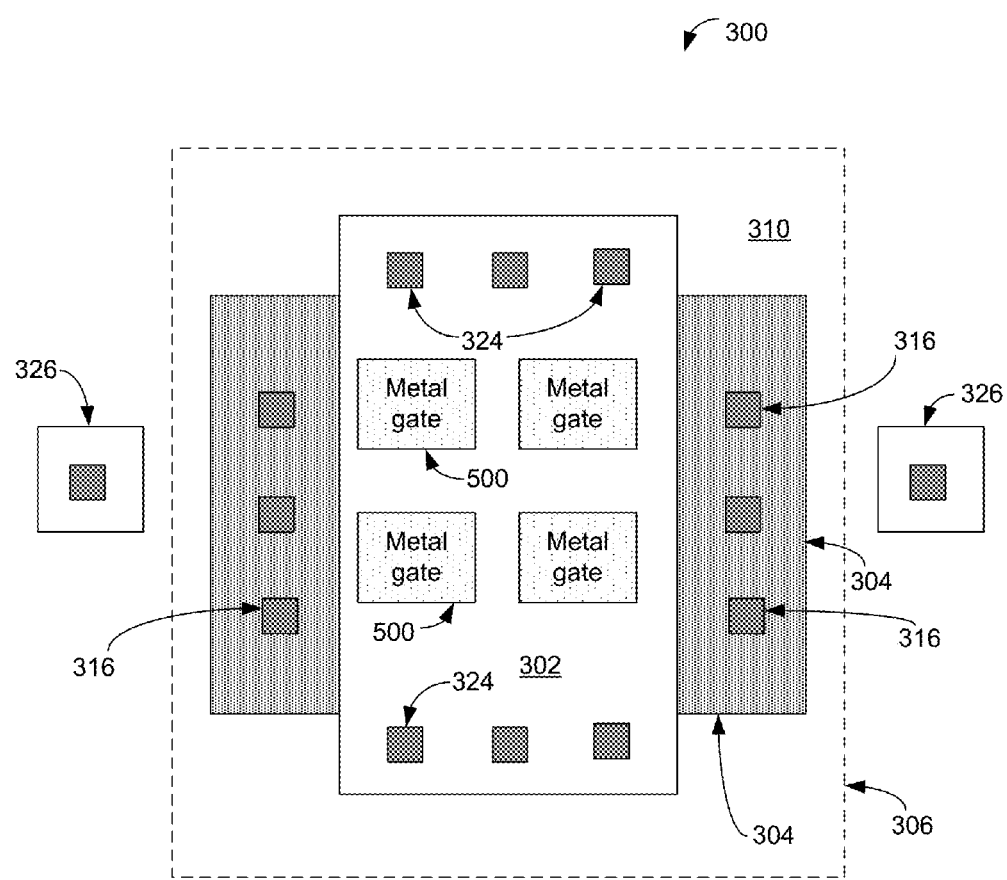

Referring to FIGS. 5A and 5B, in accordance with alternative environments, metal gates 500 may be embedded within the high-R gate 302. The metal gates 500 may be embedded via a parasitic process during the high-k metal gate integration, i.e. during the replacement of the polysilicon gate previously discussed with respect to FIG. 4F, with no additional masking required. By making a partial area or areas of the high-R gate 302 a metal gate 500, the parasitic resistance of the high-R gate 302 can be reduced while maintaining metal gate pattern density.

FIG. 5A illustrates an example of embedding a single metal gate 500 within the high-R gate 302, while FIG. 5B illustrates four metal gates 500 embedded within the high-R gate 302. More than four may be embedded if desired, while two or three metal gates 500 may be embedded if desired.

The dimensions and shape of the metal gates 500 are tunable. Thus, the length and/or width of the metal gate(s) 500 can be adjusted to adjust the parasitic resistance of the high-R gate 302. Likewise, the shape of the metal gate(s) 500 can be adjusted in addition to, or in place of, adjusting the length and/or width of the metal gate(s) 500 in order to adjust the parasitic resistance of the high-R gate 302.

Figure 6:
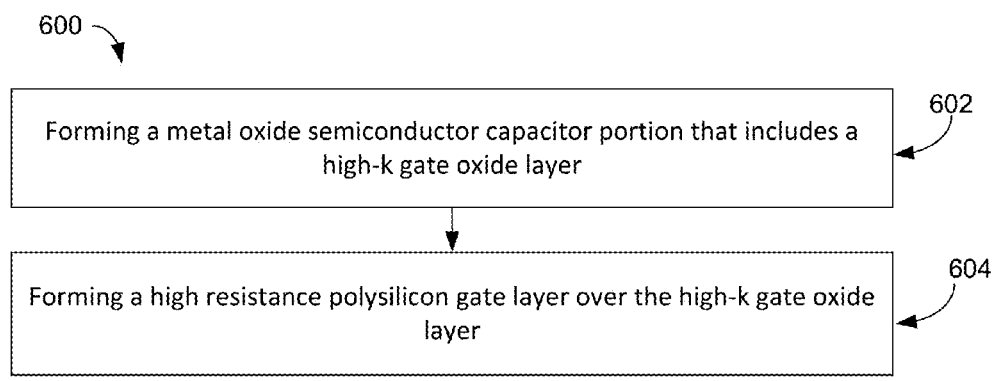
FIGS. 6 and 7 illustrate methods of forming the RC network illustrated in FIGS. 3A and 3B in accordance with techniques described herein.

FIG. 6 illustrates an example of a method 600 of forming the RC network 300 illustrated in FIGS. 3A and 3B. At 602, the method 600 includes forming a metal oxide semiconductor capacitor portion that includes a high-k gate oxide layer. At 604, the method 600 includes forming a high resistance polysilicon gate layer over the high-k gate oxide layer.

Figure 7:
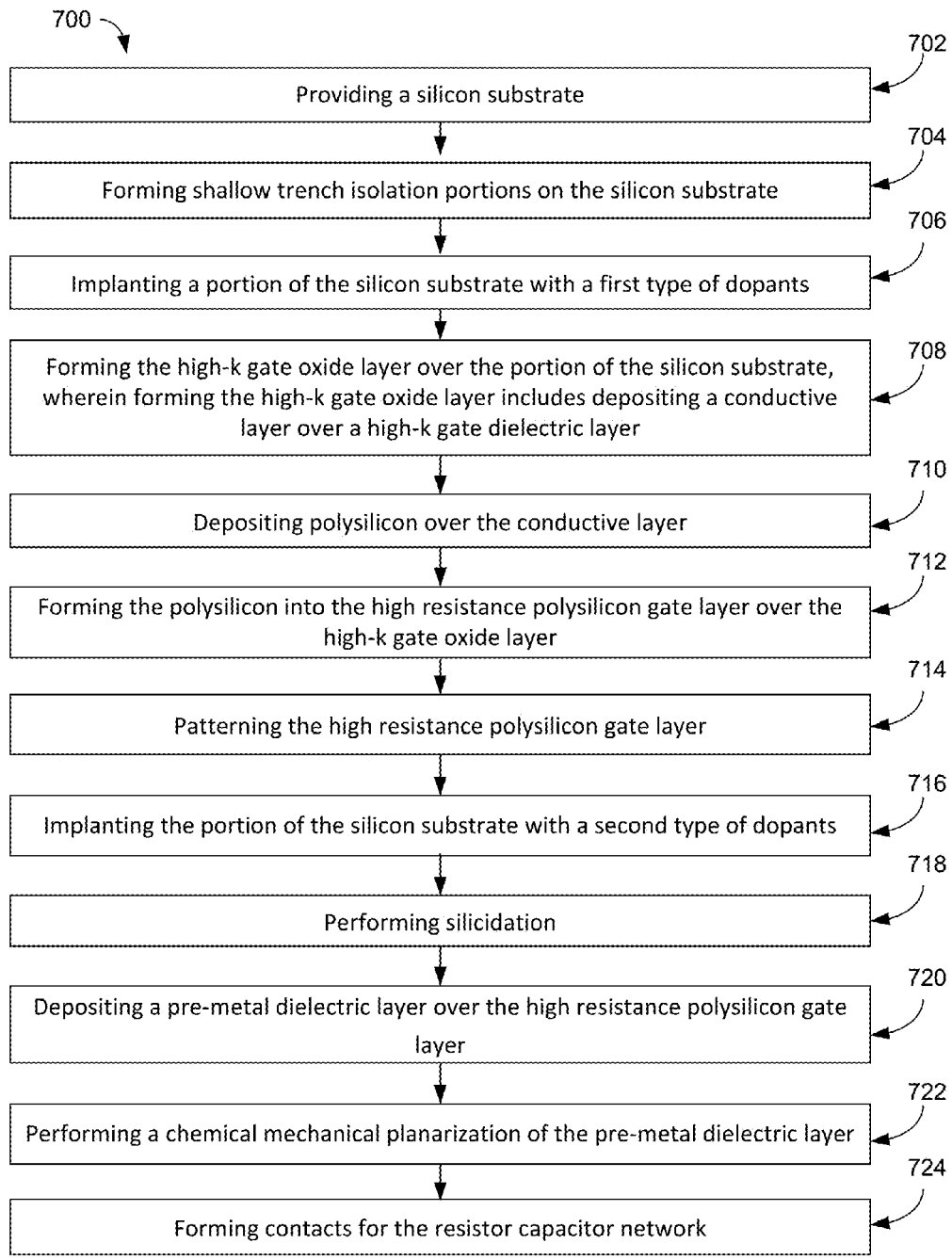

FIG. 7 illustrates an example of a method 700 of forming a metal oxide semiconductor capacitor portion that includes a high-k gate oxide layer and forming a high resistance polysilicon gate layer over the high-k gate oxide layer. At 702, the method 700 includes providing a silicon substrate. At 704, the method 700 includes forming shallow trench isolation portions on the silicon substrate. At 706, the method 700 includes implanting a portion of the silicon substrate with a first type of dopant. At 708, the method 700 includes forming the high-k gate oxide layer over the portion of the silicon substrate, wherein forming the high-k gate oxide layer includes depositing a conductive layer over a high-k gate dielectric layer. At 710, the method 700 includes depositing polysilicon over the conductive layer.

At 712, the method 700 includes forming the polysilicon into the high resistance polysilicon gate layer over the high-k gate oxide layer. At 714, the method 700 includes patterning the high resistance polysilicon gate layer. At 716, the method 700 includes implanting the portion of the silicon substrate with a second type of dopant. At 718, the method includes performing silicidation. At 720, the method includes depositing a pre-metal dielectric layer over the high resistance polysilicon gate layer. At 722, the method 700 includes performing a chemical mechanical planarization of the pre-metal dielectric layer. At 724, the method 700 includes forming contacts for the resistor capacitor network.

The description incorporates use of the phrases "in an embodiment," or "in various embodiments," which may each refer to one or more of the same or different embodiments. Furthermore, the terms "comprising," "including," "having," and the like, as used with respect to embodiments of the present disclosure, are synonymous.

The description may use perspective-based descriptions such as up/down, over/under, and/or, top/bottom, etc. Such descriptions are merely used to facilitate the discussion and are not intended to restrict the application of embodiments described herein to any particular orientation.

Various operations may have been described as multiple discrete actions or operations in turn, in a manner that is most helpful in understanding the claimed subject matter. However, the order of description should not be construed as to imply that these operations are necessarily order-dependent. In particular, these operations may not be performed in the order of presentation. Operations described may be performed in a different order than the described embodiment. Various additional operations may be performed and/or described operations may be omitted in additional embodiments.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This application is intended to cover any adaptations or variations of the embodiments discussed herein. Therefore, it is manifestly intended that embodiments in accordance with the present disclosure be limited only by the claims and the equivalents thereof.

What is claimed is:

1. An apparatus including a resistor capacitor network, the resistor capacitor network comprising:
   a metal oxide semiconductor capacitor portion that includes a high-k gate oxide layer, wherein the value of k is in a range of 4.0 to 100.0, wherein the high-k gate oxide layer comprises (i) a high-k dielectric layer and (ii) a conductive layer deposited over the high-k dielectric layer, wherein the high-k gate oxide layer does not include any metal layer;
   a high resistance polysilicon gate layer formed over the high-k gate oxide layer, wherein the resistance of the high resistance polysilicon gate layer is in a range of 100 to 2000 ohms per square, wherein no metal layer is deposited directly over any portion of an entirety of the high-k gate oxide layer;
   a metal gate embedded within the high resistance polysilicon gate layer, wherein the metal gate is configured to reduce a parasitic resistance of the high resistance polysilicon gate layer, and wherein the metal gate is embedded within the high resistance polysilicon gate layer subsequent to the formation of the high resistance polysilicon gate layer over the high-k gate oxide layer;
   a substrate;
   a well formed on the substrate, wherein the well comprises (i) a first corner region, (ii) a second corner region, and (iii) a middle region interposed between the first corner region and the second corner region, wherein the high-k gate oxide layer is formed over the middle region of the well;
   a first resistor contact and a second resistor contact formed over the high resistance polysilicon gate layer, wherein the first resistor contact and the second resistor contact are used as contacts for a resistor of the resistor capacitor network;
   a first capacitor contact formed on the first corner region; and
   a second capacitor contact formed on the second corner region,
   wherein the first capacitor contact, the second capacitor contact, the high-k gate oxide layer and the high resistance polysilicon gate layer, in combination, form a capacitor of the resistor capacitor network, and
   wherein the first capacitor contact and the second capacitor contact are used as contacts for the capacitor of the resistor capacitor network.

2. The apparatus of claim 1, further comprising a plurality of metal gates embedded within the high resistance polysilicon gate layer.

3. The apparatus of claim 2, wherein the plurality of metal gates comprises four metal gates.

4. The apparatus of claim 1, wherein:
   the middle region of the well is doped with a first dopant comprising one of N-type dopant or P-type dopant; and
   each the first corner region and the second corner region is doped with (i) the first dopant and (ii) a second dopant that is different from the first dopant.

5. The apparatus of claim 1, wherein the first capacitor contact comprises:
   a silicide portion formed on the first corner region;
   a tungsten layer formed on the silicide portion; and
   a metal layer formed on the tungsten layer.

* * * * *